(12) United States Patent
Kaminaga et al.

(10) Patent No.: US 6,378,514 B1
(45) Date of Patent: Apr. 30, 2002

(54) IGNITER FOR INTERNAL COMBUSTION ENGINE

(75) Inventors: Toshiaki Kaminaga, Naka-machi; Noboru Sugiura, Mito; Ryoichi Kobayashi, Tokai-mura; Katsuaki Fukatsu, Urizura-machi, all of (JP)

(73) Assignees: Hitachi, Ltd., Tokyo; Hitachi Car Engineering Co., Ltd., Hitachinaka, both of (JP)

( * ) Notice: Subject to any disclaimer, the term of this patent is extended or adjusted under 35 U.S.C. 154(b) by 0 days.

(21) Appl. No.: 09/726,594

(22) Filed: Dec. 1, 2000

(30) Foreign Application Priority Data

Dec. 1, 1999 (JP) ............................................. 11-341849

(51) Int. Cl.$^7$ ............................................... F02P 7/077
(52) U.S. Cl. ......................... 123/633; 123/634; 123/647
(58) Field of Search ................................ 123/633, 634, 123/647

(56) References Cited

U.S. PATENT DOCUMENTS 5,144,935 A * 9/1992 Taruya et al. ............... 123/634
5,603,307 A * 2/1997 Morita et al. ............... 123/633
5,615,659 A * 4/1997 Morita et al. ............... 123/634
6,308,696 B1 * 10/2001 Kondo et al. ............... 123/634
6,328,025 B1 * 12/2001 Marrs .......................... 123/634

* cited by examiner

Primary Examiner—Erick Solis
(74) Attorney, Agent, or Firm—Crowell & Moring LLP

(57) ABSTRACT

Object: The present invention is intended to supply an internal combustion engine-use igniter that is compact, excellent in mountability, and can contribute to the simplification and automation of assembly and to cost reduction. Implementing means: An insulated gate bipolar transistor (IGBT) is used as the ignition coil switching device for the internal combustion engine. The IGBT and a current limiting circuit intended to protect it from an overcurrent are formed on single semiconductor chip 3, and this semiconductor chip 3 and radio noise reduction capacitor 5 are contained in single packaging unit 4 having external input and output terminals 41 to 44. Packaging unit 4 is transfer-molded using a material such as epoxy resin.

15 Claims, 15 Drawing Sheets

IGNITER FOR INTERNAL COMBUSTION ENGINE

BACKGROUND OF THE INVENTION

The present invention relates to an igniter for an internal combustion engine, intended to drive the ignition coils of the internal combustion engine.

In recent years, the use of an insulated gate bipolar transistor (IGBT), instead of a bipolar power transistor, is proposed as the switching device for driving the ignition coils of the internal combustion engine used for an automobile or the like.

Since it is of the voltage-driven type with added FET (field effect transistor) structure, IGBT has the advantages that it can be driven with a very weak current, compared with the current-driven type of bipolar power transistor, that the scale of the current limiting circuit added to protect IGBT from an overcurrent can be reduced in size, and that the IGBT itself and the current limiting circuit can be compactly formed on a single IC chip.

As disclosed in Japanese Application Patent Laid-Open Publication No. Hei-10-77940, the semiconductor chip into which the IGBT and the current limiting circuit for IGBT protection from an overcurrent are integrated for use in an internal combustion engine-use igniter (this chip is also referred to as the "intelligent IGBT chip") is built into the TO-220 type of packaging unit, which is a standard package for an ignition power system, and this packaging unit is further mounted in the ignition coil unit.

(1) Since this type of ignition coil unit generates noise during ignition and the noise is induced as radio noise through power conductors, some users require in their specifications that a capacitor for minimizing radio noise be inserted between the power supply and the grounding terminal.

Up to now, the capacitor for reducing radio noise has been mounted outside the igniter casing that contains igniter driving circuits, or as disclosed in Japanese Application Patent Laid-Open Publication No. Hei-10-149934, the capacitor has been provided separately from the igniter driving circuit board in the igniter casing. In the latter case, a capacitor with lead wires has been connected (using a method such as soldering) to the frame that constitutes, among all external connection connector terminals provided in or on the igniter casing, only the grounding terminal and the power terminals for the primary and secondary currents.

(2) Also, other users specify a multi-functional igniter containing not only a current limiting function for IGBT protection from an overcurrent, but also a self-protection circuit . . . for example, a so-called "self-shutoff function" for shutting off the current within the time during which the igniter driving circuits themselves will not become damaged, even if the ignition signal input time is unusually extended.

When circuits provided with these added functions (for example, a current limiting function for IGBT protection from an overcurrent, and a self-protection circuit) are to be formed using the prior art, a method has been adopted that requires forming a resistor and other circuit elements on a thick-film printed circuit board and mounting a monolithic IC, a capacitor, and other components, on the circuit board. The use of such a method increases costs since it requires the use of two semiconductor devices: an IGBT chip and a monolithic IC.

However, IGBT and a circuit having the added functions mentioned above (for example, a monolithic IC) can be mounted in integrated form on a single semiconductor chip, and this method enables the manufacture of an multifunctional intelligent-type chip.

The aforementioned self-protection circuit, however, is a so-called power supply type circuit operating by obtaining the necessary power from a battery power supply via a power resistor. If such a circuit is mounted together with IGBT on a single chip, therefore, power must be supplied to the chip (if the chip has only IGBT and a current limiting circuit and does not have a power supply type circuit, a circuit for obtaining power from the battery power supply via a power resistor will not be required since all that will be required is just to supply signals and the primary current to the chip).

Various types of noise surges are superimposed on the power lines of internal combustion engines. If a power supply type circuit is mounted together with IGBT on a single semiconductor chip, therefore, the semiconductor chip needs to be protected from such noise, and thus a capacitor, a resistor, and other components are required. That is to say, if these circuit protectors such as a capacitor and a resistor are mounted on the semiconductor chip, the chip size will be very large.

A radio noise reduction or surge absorption capacitor, in particular, requires a capacity of 10,000 pF or more. Even if, in an attempt to form a capacitor on a semiconductor chip, only a capacitor is formed on a chip as small as 5 mm square, a capacity not more than several thousands of picofarads can only be obtained. It is very costly and not realistic for a capacitor, a resistor, and/or other power circuit protectors to be mounted on a semiconductor device whose cost is almost proportionated to the chip size.

(3) It is also required that an electronic circuit with other electronic components be built into an igniter to realize an ignition coil unit with added functions. It takes a higher ignition coil assembly cost to independently mount electronic components, an electronic unit using the circuit board on which the electronic components are mounted, and igniter driving circuits, in or on the ignition coil unit.

SUMMARY OF THE INVENTION

The objective of the present invention is to supply an internal combustion engine-use igniter that: solves the various problems described above, is compact and excellent in mountability, and can contribute to the simplification and automation of assembly and reduce costs.

The basic configuration of the present invention for achieving the above mentioned objective is described below.

(1) One igniter is proposed, wherein: IGBT is used as the switching device for an ignition coil unit designed for an internal combustion engine, said IGBT and a current limiting circuit for IGBT protection from an overcurrent are formed on a single semiconductor chip, and this semiconductor chip (a so-called "intelligent-type chip") and a capacitor for reducing radio noise are contained in a single packaging unit having external input and output terminals.

The packaging unit mentioned above is a transfer molding made of, for example, epoxy resin.

(2) Another igniter is proposed, wherein: said IGBT, a current limiting circuit for IGBT protection from an overcurrent, and a power supply type circuit are integrated on a single semiconductor chip, except for the power resistor of the power supply type circuit, and this semiconductor chip, the power resistor, and a radio noise reduction/surge absorption capacitor are contained in a single packaging unit having external input and output terminals.

(3) Still another igniter is proposed, wherein, as with the above-described igniter: said IGBT and a current limiting circuit for IGBT protection from an overcurrent are integrated on a single semiconductor chip, and this semiconductor chip and a Zener diode for the confirmation of engine control unit connection are contained in a single packaging unit having external input and output terminals.

The actions and effects of the igniters proposed above are detailed in the following description of embodiments:

DESCRIPTION OF THE PREFERRED EMBODIMENTS

Embodiments of the present invention are described using drawings.

Figure 1:
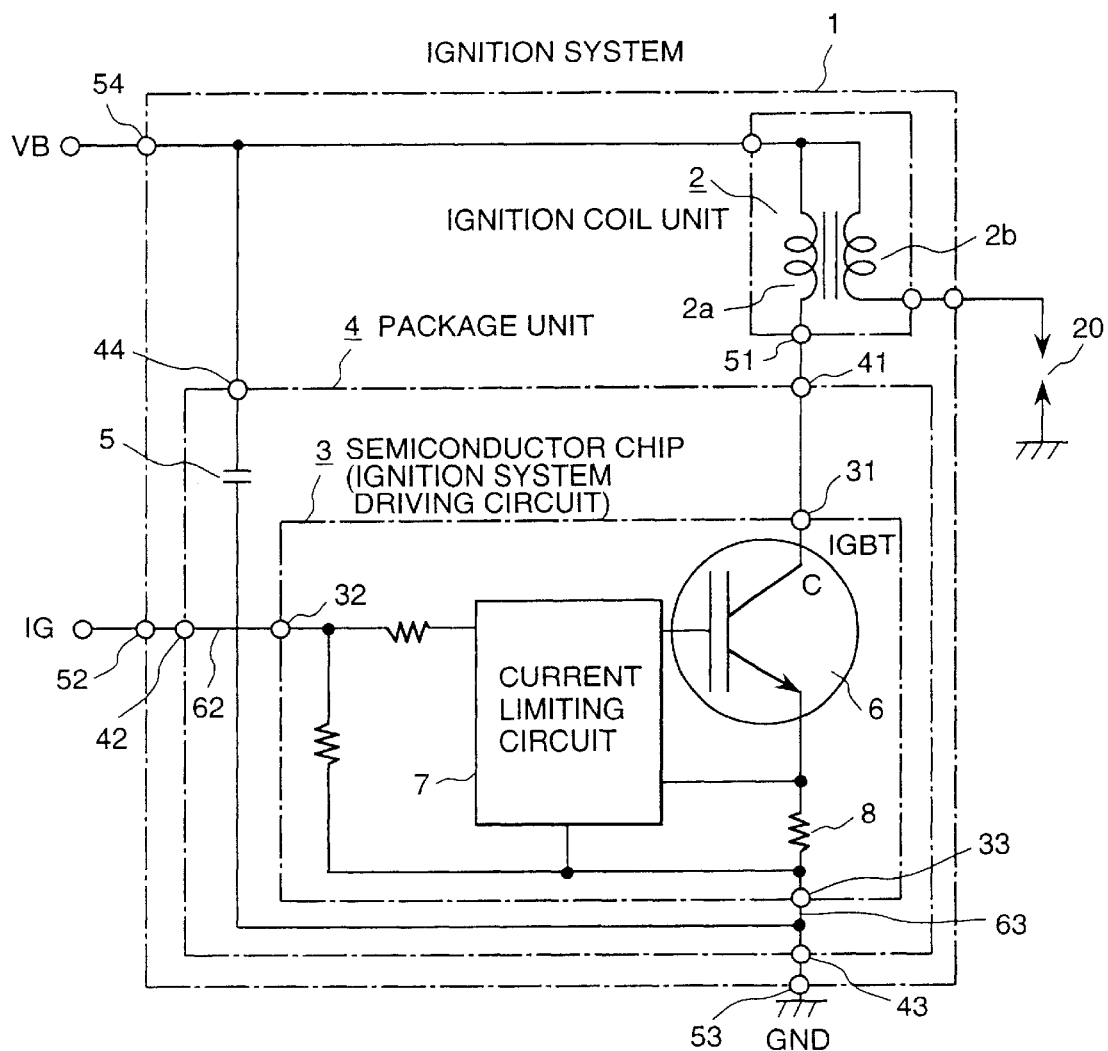
FIG. 1 is a circuit diagram of the igniter for an internal combustion engine that pertains to the first embodiment of the present invention.
Figure 2:
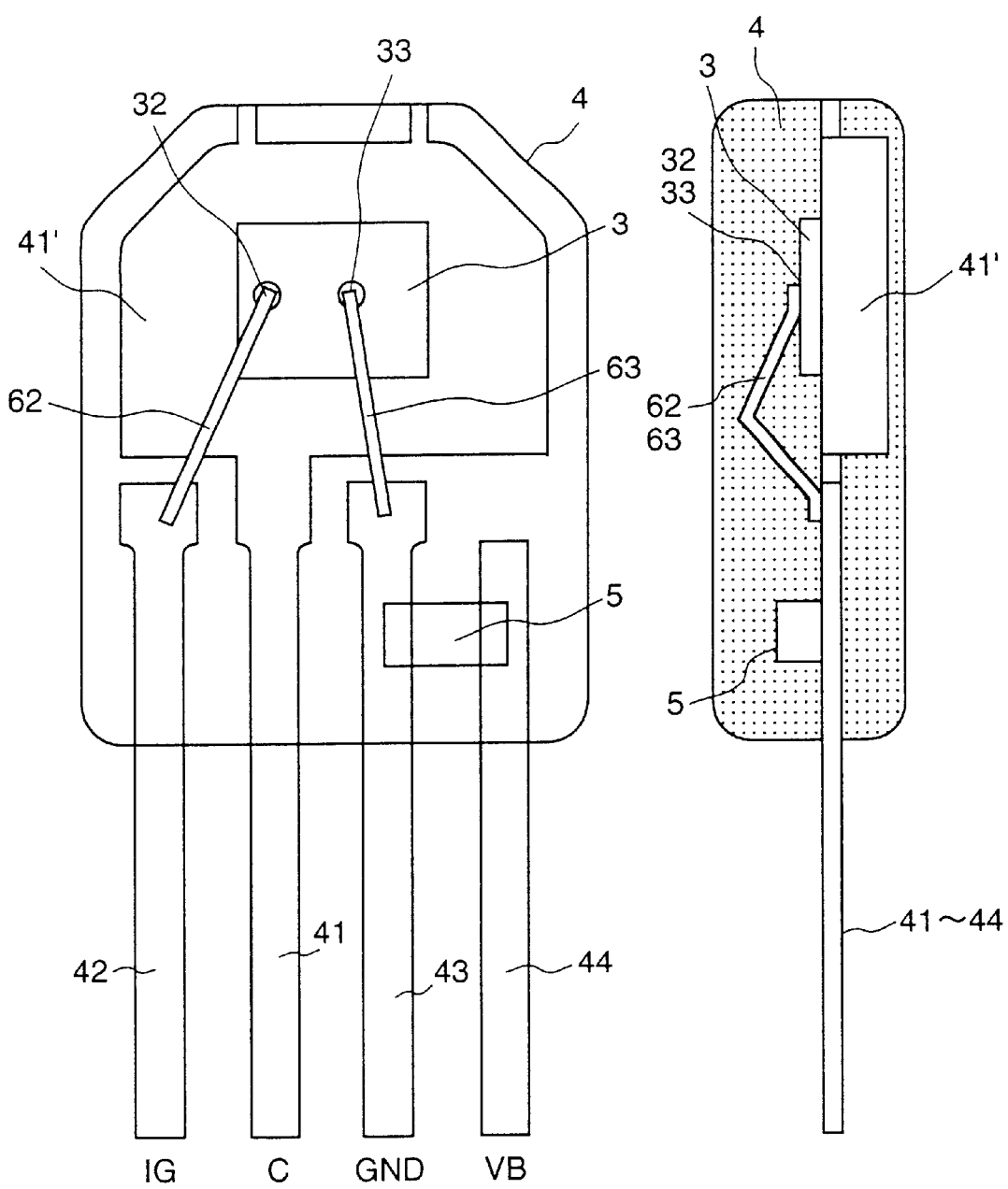
FIG. 2 is a plan view and cross-sectional side view of the packaging unit in the igniter corresponding to the above mentioned embodiment.
Figure 3:
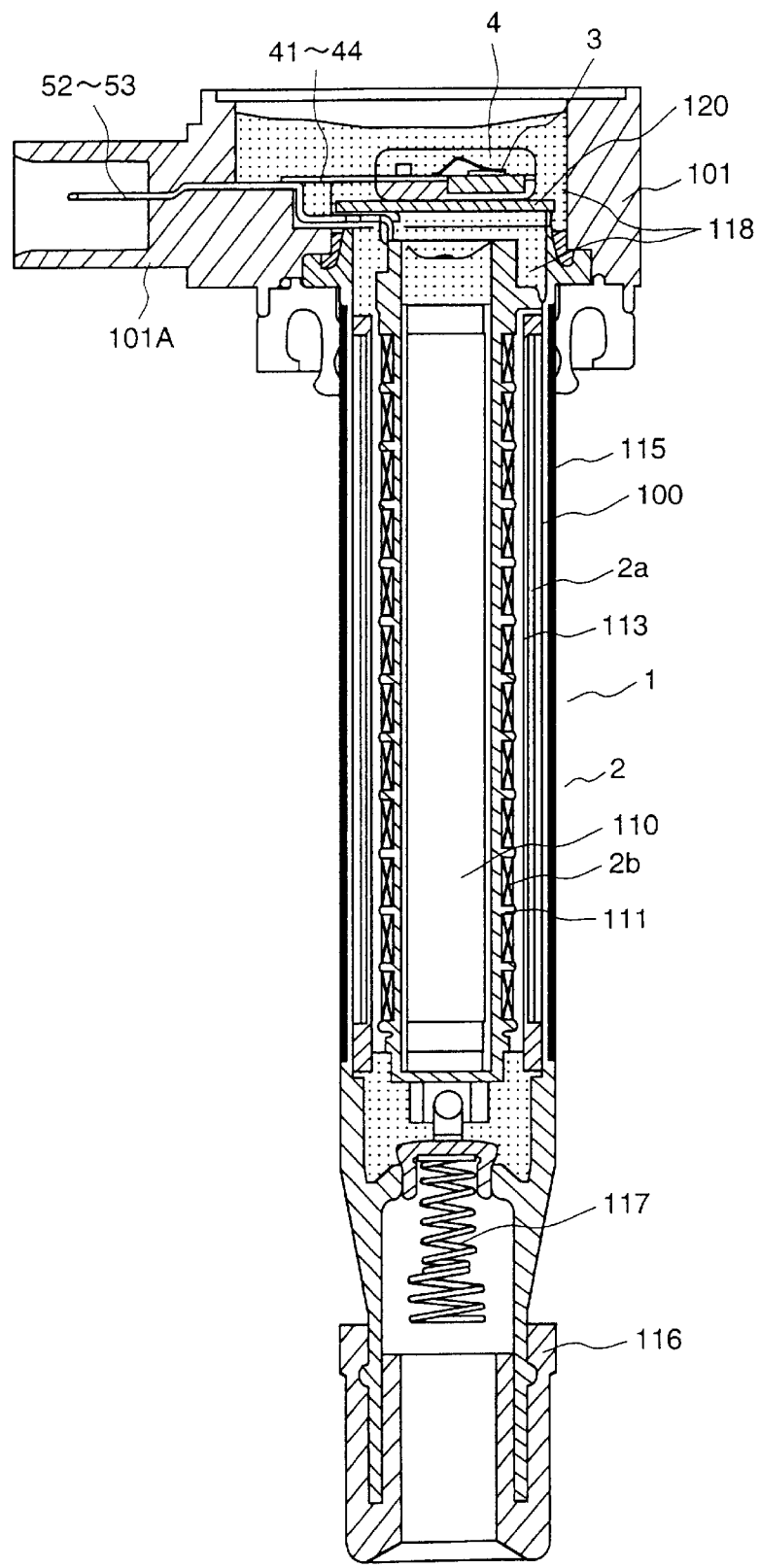
FIG. 3 is a longitudinal section showing an example of an igniter equipped with the above mentioned packaging unit.
Figure 4:
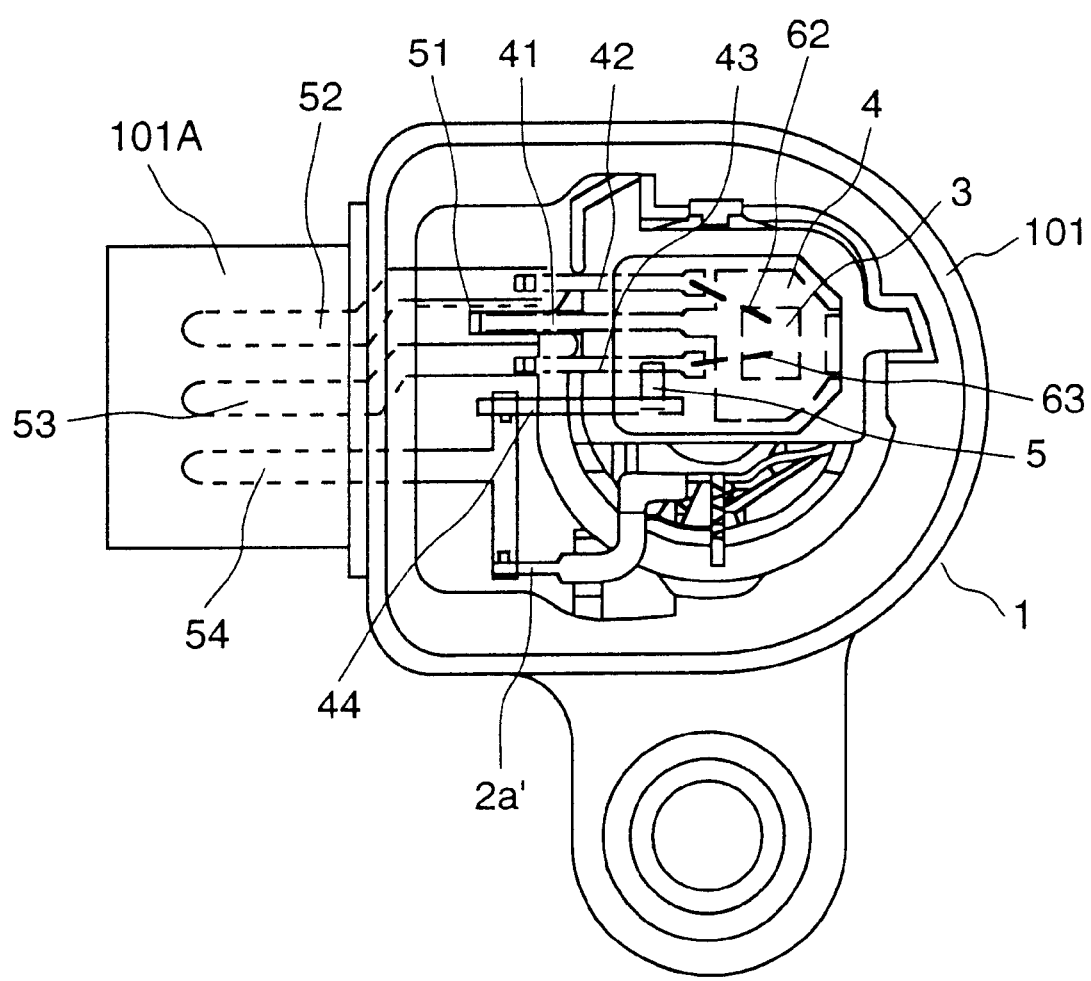
FIG. 4 is a top view of the igniter mentioned above (this top view, however, shows the igniter existing before its casings are charged with insulating resin 118).

FIG. 1 is a circuit diagram of an internal combustion engine-use igniter relating to embodiment 1 of the present invention. FIG. 2 is a plan view and cross-sectional side view of the packaging unit in the igniter outlined in the above mentioned embodiment. FIG. 3 is a longitudinal section showing an example of an igniter equipped with the above-mentioned packaging unit. FIG. 4 is a top view of the igniter shown in FIG. 3 (this top view, however, shows the igniter existing before its casings are charged with insulating resin 118).

Igniter 1 shown in FIGS. 3 and 4 is of the independent ignition type connected directly to the ignition coils of the internal combustion engine, and an integrated set consisting of ignition coil unit 2 and igniter driving circuits 3 is used as the main unit. The scope of application of the present invention, however, is not limited to this configuration.

First, entire igniter 1 is outlined using FIGS. 3 and 4.

Within cylindrical coil casing 100 of coil unit 2 of igniter 1, center core 110, secondary bobbin 111, secondary coil 2b, primary bobbin 113, and primary coil 2a are concentrically arranged in that order from inside. Also, side core 115 is provided on the outer surface of coil casing 100. Side core 115 and center core 110 constitute a magnetic circuit.

The casing for accommodating the module of igniter driving circuits (semiconductor chip) 3 is mounted at the top of coil casing 100. Hereinafter, this casing is referred to as igniter casing 101.

Igniter casing 101 has insert-molded external connection connector terminals 52 and 53 and ignition coil connection terminal 51. Insert-molding refers to embedding components (terminals) in a resin mold (in this case, the igniter casing) during molding. These terminals 51 to 53 can be secured using a method such as bonding, instead of insert-molding.

Connector terminal 51 is for connecting one end of primary coil 2a and collector terminal 31 of IGBT 6 as shown in FIG. 1, and is directly connected to terminal 41 of packaging unit 4.

Connector terminal 52 is an ignition signal (IG) input connector terminal. Ignition signals are sent from the engine control unit, which is not shown in the figure.

Connector terminal 53 functions as the grounding terminal (GND) to be connected from the emitter of IGBT 6, and connector terminal 54 functions as the power terminal to be connected to battery power supply VB.

These terminals 52 to 54 are connected to the appropriate external input and output terminals 42 to 44 of packaging unit 4. Connector terminal 54 for power is also connected between one end 2a' of the primary coil and one end of secondary coil 2b as shown in FIG. 4.

Igniter casing 101 and coil casing 115 are charged with epoxy resin 118 to provide electrical insulation of the coil members.

Although radio noise reduction capacitor 5 is contained in packaging unit 4 as described later in this SPECIFICATION, this capacitor is basically connected between the power line and the ground. Radio noise reduction capacitor 5 is effective for noise reduction, since it is located near the coils that generate noise.

When ignition plug mounting cap 116 is applied over an ignition plug (not shown in the figure), the ignition plug will be electrically connected via spring terminal 117.

The igniter driving circuit module to which the present invention is applied can be housed in the ignition coil casing.

The circuit composition shown in FIG. 1 is equivalent to the configuration of the igniter 1 shown in FIG. 3, and each component of the igniter is independently systematized as shown by the frame of a single-dash dotted line. IGBT 6, which constitutes igniter driving circuits 3, and current limiting circuit 7 for IGBT protection from an overcurrent, are formed in collective form on semiconductor chip 3.

Resistor 8 for detecting the current that flows through IGBT 6, and current limiting circuit 7 receives the input of the detected current value and controls the ignition signal (IG) level so that an overcurrent does not flow into IGBT 6. Numeral 20 denotes an ignition plug.

In the present embodiment, above-mentioned semiconductor chip 3 (intelligent-type chip) and radio noise reduction capacitor 5 are contained in the packaging unit having external input and output terminals 41 to 44.

FIG. 2 shows an example of packaging unit 4 mentioned above, that is to say, the packaging unit that contains intelligent-type chip 3 and radio noise reduction capacitor 5.

Packaging unit 4 is an epoxy resin transfer molding, in which said semiconductor chip 3, radio noise reduction capacitor 5, and external input and output terminals 41 to 44 are insert-molded.

As shown in FIG. 1, the external input and output terminals mentioned above consist of ignition signal input terminal 42, collector terminal 41, and grounding terminal 43, each of which is to be connected to the gate, collector, and emitter, respectively, of IGBT 6, and battery power terminal 44 for connection to the plus (+) side of a battery power supply as a special terminal for radio noise reduction capacitor 5; wherein radio noise reduction capacitor 5 is connected between power terminal 44 and grounding terminal 43, and the connection is performed by soldering or electroconductive bonding.

Since neither IGBT 6 nor current limiting circuit 7 needs to have a special power supply circuit in themselves, packaging unit 4 originally does not require power terminal 44. In the present embodiment, however, power terminal 44 is added to enable radio noise reduction capacitor 5 to be mounted in packaging unit 4. Thus, capacitor 5 in packaging unit 4 can be connected between the plus (+) power terminal and the grounding terminal.

External input and output terminals 41 to 44 consist of lead frames made of copper or the like. The lead frame constituting collector terminal 41 is molded into a single unit integrated with base frame 41' on which semiconductor chip 3 is mounted. Semiconductor chip 3 on base frame 41' is secured by soldering or electroconductive bonding, and lead frame 41 and the collector terminal 31 (shown in FIG. 1) of the IGBT 6 on semiconductor chip 3 are electrically connected on the reverse side thereof.

Of all external input and output terminals of packaging unit 4, only ignition signal input terminal 42 and grounding terminal 43 are connected via bonding wires; the former terminal being connected to signal input terminal (gate) 32 of semiconductor chip 3 via bonding wire 62, and the latter terminal being connected to grounding terminal (emitter) 33 of semiconductor chip 3 via bonding wire 63.

Semiconductor chip 3, capacitor 5, and external input and output terminals 41 to 44, including the bonding wires, are packaged in the transfer molding of epoxy resin.

It is preferable that the after-cure linear expansion coefficient of the epoxy resin used for packaging should be as close as possible to either linear expansion coefficient of the coil components contained in the package. Reliability can therefore be achieved by selecting a linear expansion coefficient from a 3 ppm/°C.–17 ppm/°C. range, which covers the linear expansion coefficients of the internal coil components. A linear expansion coefficient from $8 \times 10^{-6}$/°C. to $16 \times 10^{-6}$/°C. is selected as its optimal value in the present embodiment.

Also, reliability can be achieved by setting the glass transition temperature of the epoxy resin to a value equal to, or greater than, a junction temperature of 150° C., which is the operational guarantee temperature of intelligent-type chip 3.

Figure 5:
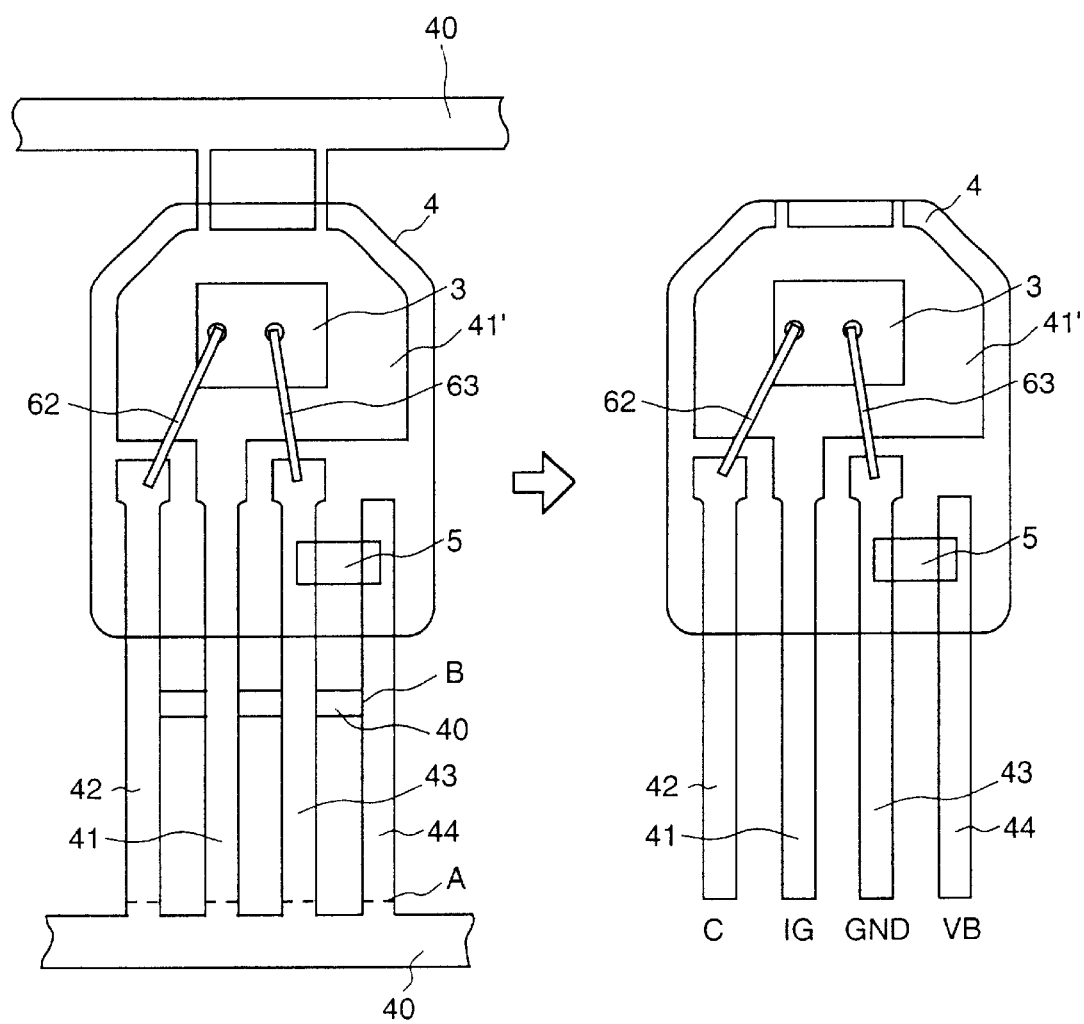
FIG. 5 is an explanatory diagram showing one of the manufacturing processes for the packaging unit (igniter driving circuit module) mentioned above.

One of the manufacturing processes for the packaging unit 4 (igniter driving circuit module) pertaining to the present embodiment is shown in FIG. 5.

Since external input and output terminals (lead frames) 41 to 44 and base frame (chip mounting base) 41' are die-cuttings of frame 40, these terminals and the base frame are initially connected as shown in the left view of FIG. 5. Under this state, intelligent-type IGBT chip (semiconductor chip) 3, capacitor 5, and bonding wires 62 and 63 are mounted and then integrated into a packaging unit transfer-molded using epoxy resin 4. After this, the unnecessary sections connecting the lead frames are cut off as shown by symbols A and B. Thereby, the final packaging unit 4 (igniter driving circuit module) with independent terminals is obtained as shown in the right view of FIG. 5.

The manufacture of such an igniter driving circuit module can almost be automated in the process preceding the mounting of the ignition coil components.

According to the present embodiment, the following actions and effects can be obtained:

1) The occurrence of radio noise during ignition coil current shutoff can be prevented effectively.

2) Since one chip 3 (IGBT and the igniter driving circuits including the current limiting circuit for IGBT protection from an overcurrent) and radio noise reduction capacitor 5 can be packaged into a single unit during pre-assembly of the entire igniter, igniter driving circuit board mounting can be completed just by storing the above-mentioned packaging unit 4 into igniter casing 101 and then welding, bonding, or soldering its external input and output terminals 41–44 onto the appropriate connector terminals 52–54 or ignition coil connector terminal 51 provided in or on the igniter casing.

Therefore, it becomes unnecessary to mount individual components, one at a time, in the main unit (for example, igniter casing) of the igniter, with the result that the assembly itself can be simplified considerably.

More specifically, since all that is required for the assembly of the ignition coil circuit is just to add terminal connection to the mounting of packaging unit 4, the total number of assembly man-hours can be reduced.

3) In addition, this method is excellent in that it enables easy mounting of components. That is to say, this method enables IGBT, a current limiting circuit, and related components to be formed while at the same time maintaining the compact chip size, and thus these sections to be mounted compactly in the main unit (for example, igniter casing) of the igniter.

4) Furthermore, it is possible to improve productivity and reduce costs by accelerating the automation of the igniter driving circuit module along with the simplification of assembly.

5) At present, the IGBT chip is built into the TO-220 package, which is a standard package for a power-based ignition power system, and since the present invention covers packaging on an extension line from this standard style of packaging, the necessary circuits can be easily composed by altering part of the packaging unit.

Figure 6:
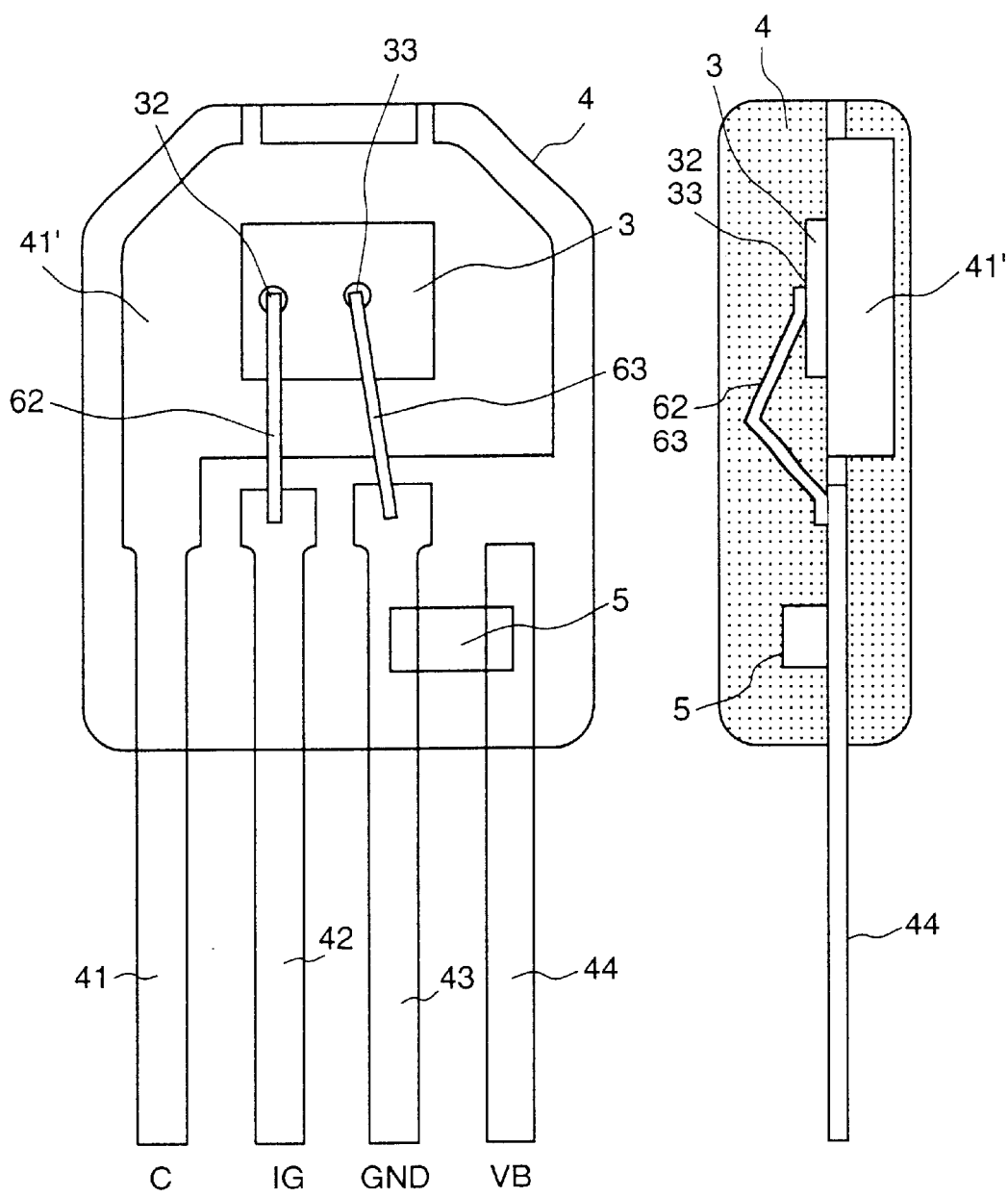
FIG. 6 is a plan view and cross-sectional side view of the packaging unit used in the second embodiment of the present invention.
Figure 7:
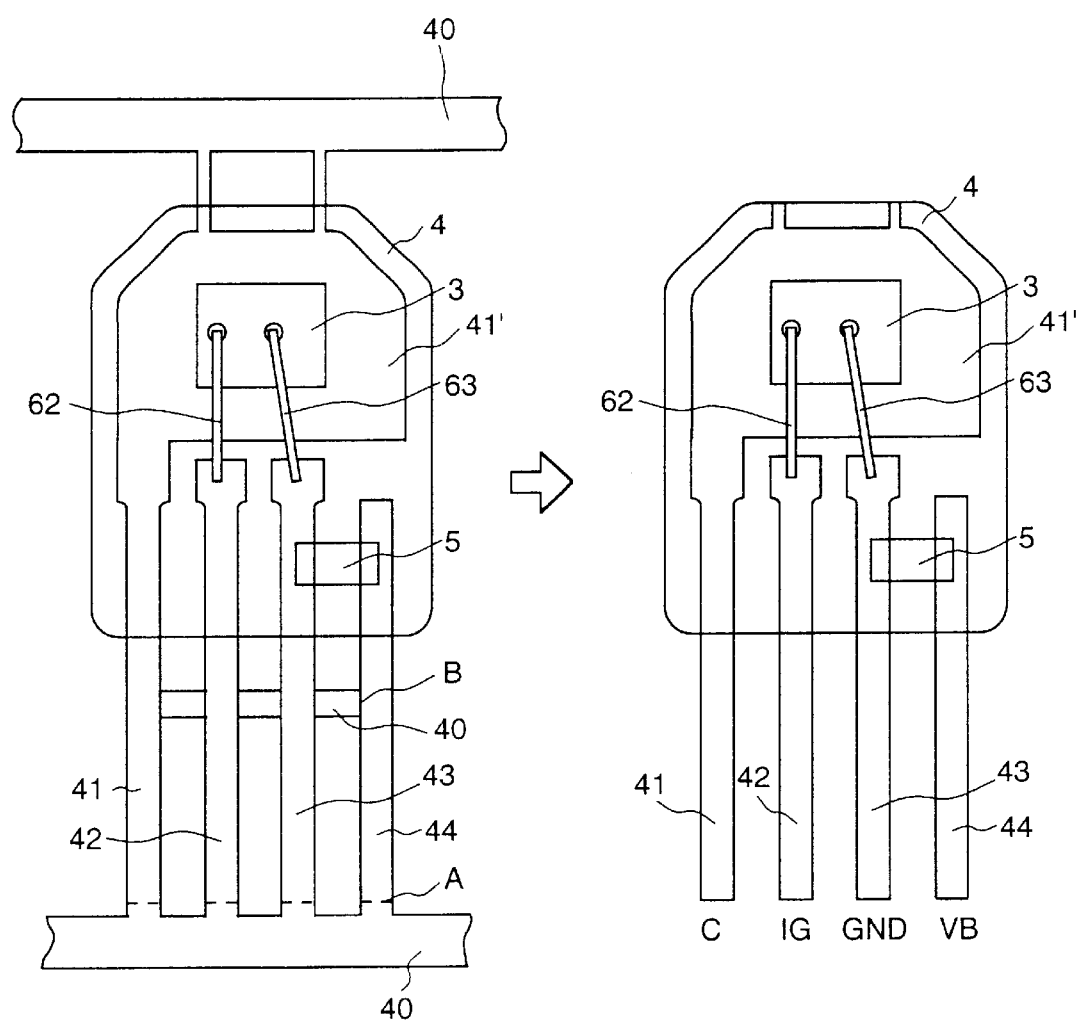
FIG. 7 is an explanatory diagram showing one of the manufacturing processes for the packaging unit in the second embodiment mentioned above.

External input and output terminals 41 to 44 mentioned above can be freely arranged and for example, the arrangement of ignition signal input terminal 42 and collector terminal 41 can be changed as in the second embodiment of FIGS. 6 and 7. Also, battery power terminal 44 and grounding terminal 43 can be arranged next to one another to provide ease in the connection of capacitor 5.

Figure 8:
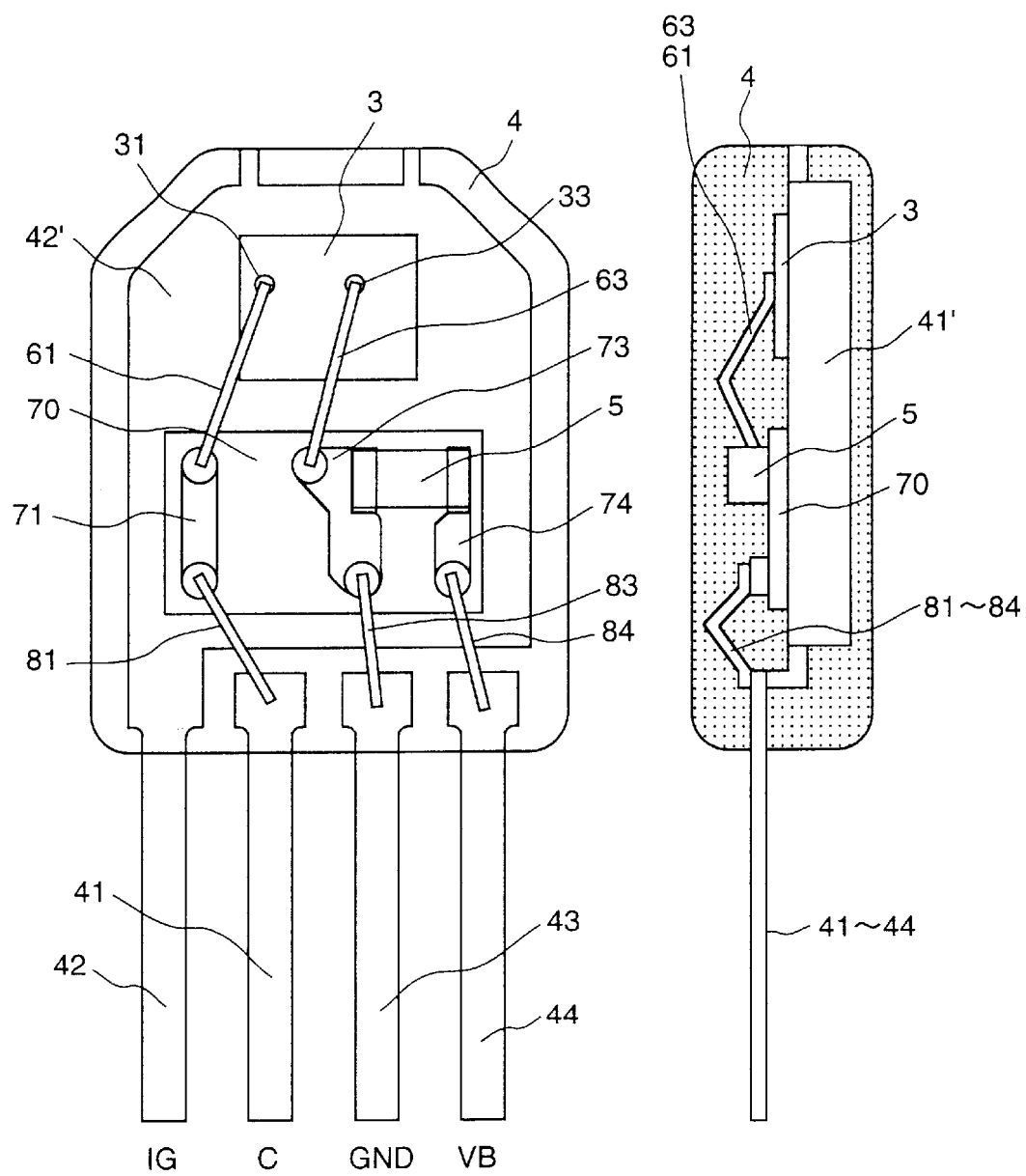
FIG. 8 is a plan view and longitudinal section of packaging unit 4 in the igniter corresponding to the third embodiment of the present invention.

A plan view and longitudinal section of packaging unit 4 of the igniter pertaining to the third embodiment of the present invention is shown as FIG. 8. In this figure, the same numerals as those which are used in the embodiments described hereinbefore denote the same elements or common elements.

The difference of the present embodiment from the embodiments described hereinbefore exists in the mounting method relating to radio noise reduction capacitor 5 within packaging unit 4.

More particularly, in the present embodiment as well, semiconductor chip 3 (igniter driving circuit module), radio noise reduction capacitor 5, and external input and output terminals 41 to 44 are insert-molded in epoxy resin transfer molding 4 (packaging unit).

Radio noise reduction capacitor 5 is mounted on insulating circuit board 70. In the present embodiment, lead frame 42 to function as an ignition signal input terminal, and base frame 42' on which chip 3 is to be mounted are molded into a single unit. Junction conductor 71 for collector use, junction conductor 73 for grounding terminal use, and junction conductor 74 for battery power VB are formed on circuit board 70, on which capacitor 5 is then connected between junction conductors 73 and 74.

One end of junction conductor 73 for grounding terminal use is connected to grounding terminal (emitter terminal) 33 of chip 3 via bonding wire 63, and the other end is connected to grounding terminal 43 of packaging unit 4 via bonding wire 83.

One end of junction conductor 74 for power is connected to capacitor 5, and the other end is connected to battery power terminal 44 of packaging unit 4 via bonding wire 84.

One end of junction conductor 71 for collector use is connected to collector terminal 31 of chip 3 via bonding wire 61, and the other end is connected to collector terminal 41 of packaging unit 4 via bonding wire 81.

Semiconductor chip 3 is bonded to base frame 42' via an electroconductive material such as solder (not shown in the figure), and is connected to the ignition signal input terminal provided on the reverse side of chip 3 via base frame 42'.

Insulating circuit board 70 is formed of a ceramic or glass epoxy material, and junction conductors 71, 73, and 74 are formed by coating with a copper-based material.

The igniter driving circuit module can be configured by arranging chip 3 and circuit board 70 adjacently and packaging these members, bonding wires 61, 63, 81, 83, and 84, base frame 42', lead frames (external input and output terminals) 41 to 44, and other related components, in the transfer molding made of epoxy resin.

With the present embodiment, the same actions and effects as those of the embodiments described hereinbefore can be anticipated.

The capacitor mounting methods in the first and second embodiments described hereinbefore enable the minimum required configuration at minimum costs, whereas the present embodiment requires a circuit board and thus slightly increases costs. The use of this circuit board to mount capacitor 5, however, enables capacitor mountability and reliability to be improved. Other functions can also be added to this circuit board.

Figure 9:
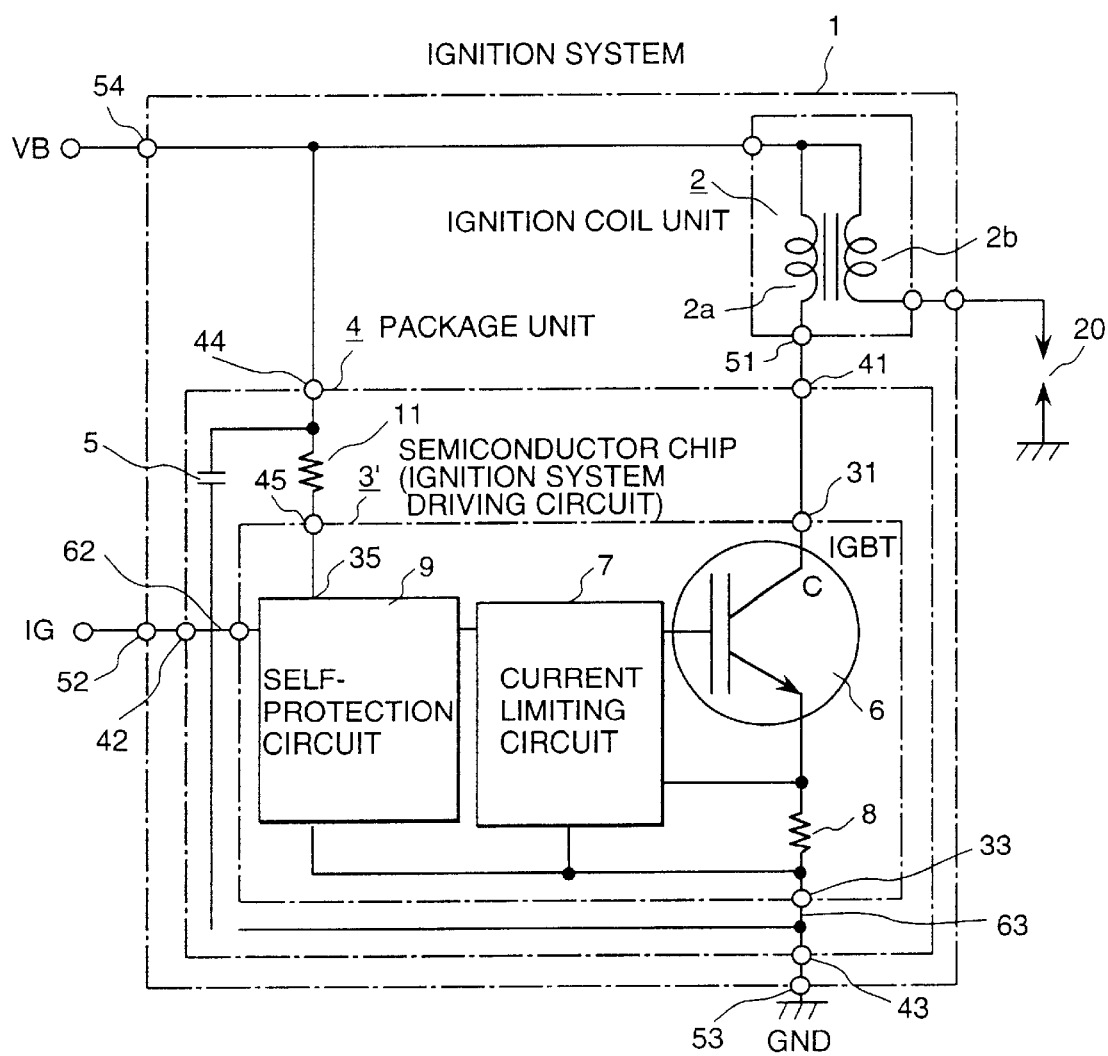
FIG. 9 is a circuit diagram of the igniter pertaining to the fourth embodiment of the present invention.

A circuit block diagram of the igniter pertaining to the fourth embodiment of the present invention is shown as FIG. 9. A plan view and longitudinal section of the packaging unit used for this igniter is shown as FIG. 10.

The difference of the present embodiment from the prior art described hereinbefore resides in that in addition to IGBT 6 and current limiting circuit 7, self-protection circuit 9 is formed on semiconductor chip 3'.

Self-protection circuit 9 has a so-called "current shutoff function" by which, immediately before the "on" duration of the ignition signal exceeds the preset maximum allowable "on" duration of the primary current of the ignition coil unit, the primary current is shut off to ensure that its "on" duration always stays within the preset maximum allowable value.

In the present embodiment, since self-protection circuit 9 is also formed on semiconductor chip 3', the following considerations are incorporated:

Self-protection circuit 9 is a so-called power supply type circuit operating by obtaining the necessary power from a battery power supply via a power resistor. In self-protection circuit 9, to ensure that radio noise reduction capacitor 5 also functions as a surge absorption capacitor, capacitor 5 is routed from the clearance between power resistor 11 of circuit 9 and power VB and connected to the grounding terminal (GND).

Also, if capacitor 5 and power resistor 11 are formed on semiconductor chip 3', this chip will significantly increase in dimensions (and hence, in cost), the former two components are mounted separately from chip 3' and then all three components (chip 3', capacitor 5, and resistor 11) are built into single packaging unit 4 as described hereinbefore.

Figure 10:
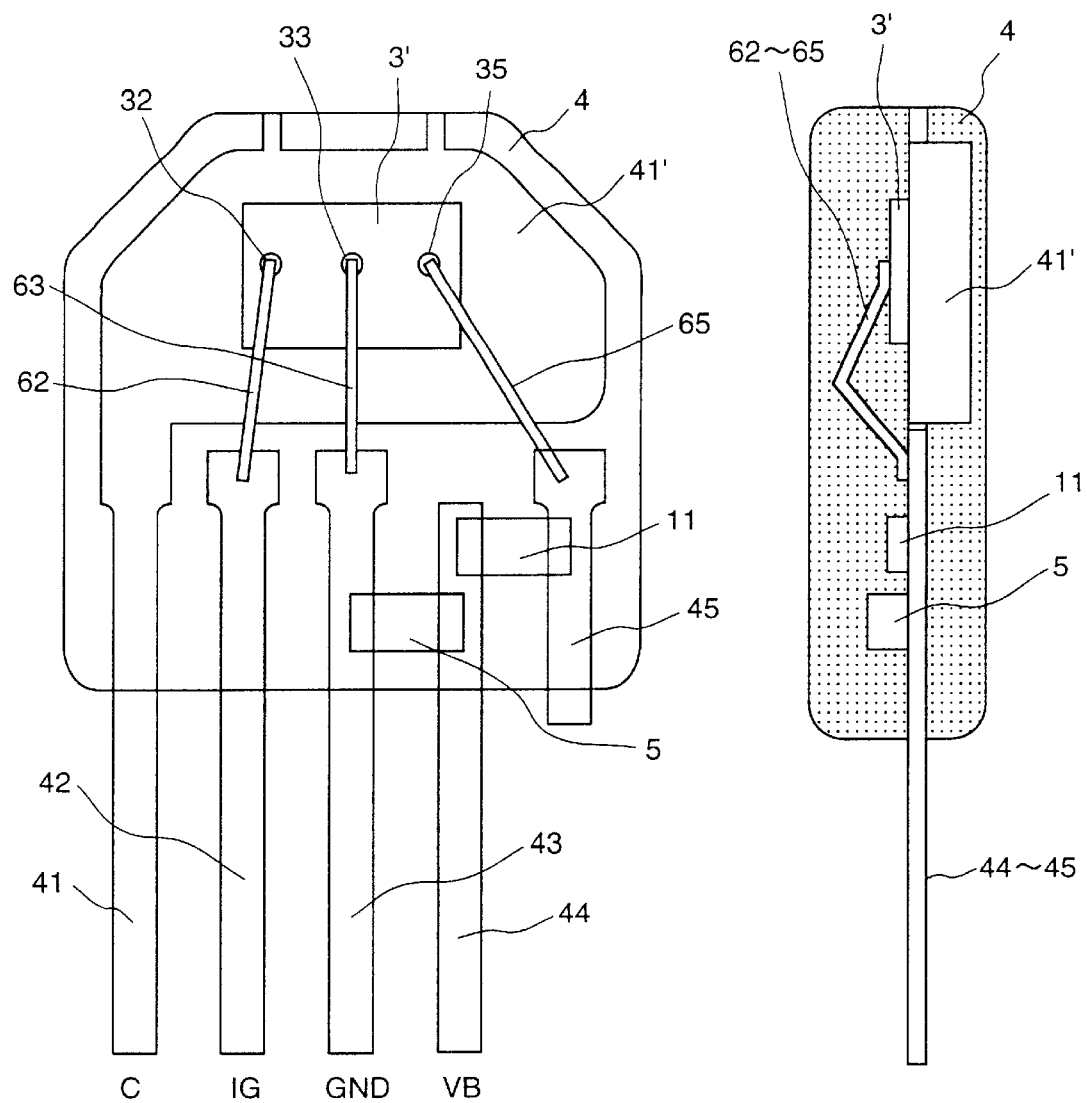
FIG. 10 is a plan view and cross-sectional side view of the packaging unit used in the fourth embodiment.

That is to say, in the present embodiment, as shown in FIG. 10, above mentioned semiconductor chip 3' (this comprises IGBT 6, current limiting circuit 7, and self-protection circuit 9), radio noise reduction/surge absorption capacitor 5, power resistor 11, and external input and output terminals 41 to 45 are insert-molded in epoxy resin transfer molding 4.

In addition to the terminals of the lead frame type described hereinbefore (namely, ignition signal input terminal 42, collector terminal 41, and grounding terminal 43), the external input and output terminals consist of power terminal 45 for a power supply type circuit and special terminal 44 for radio noise reduction/surge absorption capacitor 5 (terminal 44 is a battery power terminal for connection to the plus terminal of the battery power supply). Radio noise reduction/surge absorption capacitor 5 is connected between battery power terminal 44 and grounding terminal 43, and power resistor 11 is connected between battery power terminal 44 (VB) and power terminal 45 (VCC). Thus, the power circuit is completed.

The function of the power supply type circuit is not limited to self-protection; any other types of functions can also be added if other circuits for supplying power to the chip are to be provided in order to implement multifunctional circuit composition.

Figure 11:
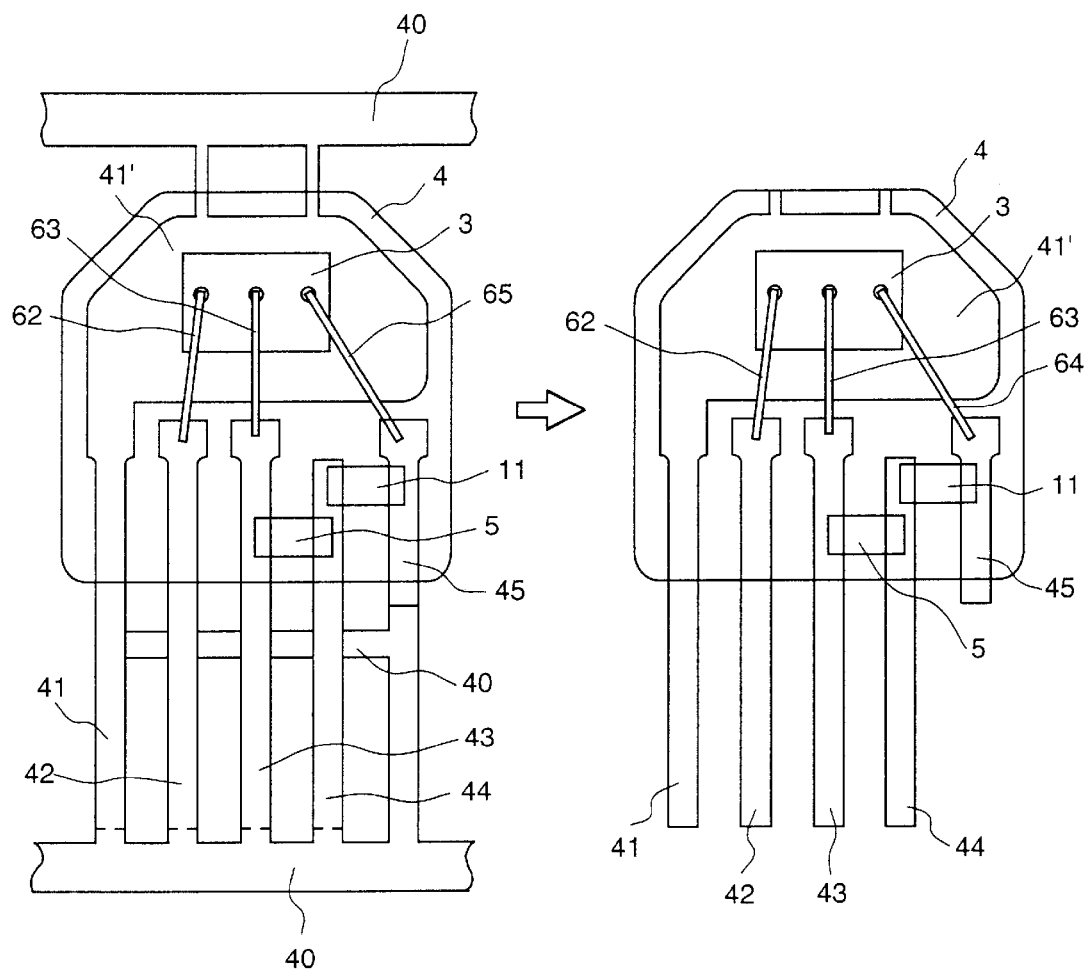
FIG. 11 is an explanatory diagram showing an example of a manufacturing process relating to the fourth embodiment.

An example of a manufacturing process concerning the present embodiment is described using FIG. 11.

External input and output terminals (lead frames) 41 to 45 and base frame 41' are initially connected as shown in the left diagram of FIG. 11. After components 5, 5, and 11 have been mounted on the frames and then wire-bonded, these frames are transfer-molded and then as shown in the right diagram, unnecessary terminal connections are removed to obtain the final configuration.

Figure 12:
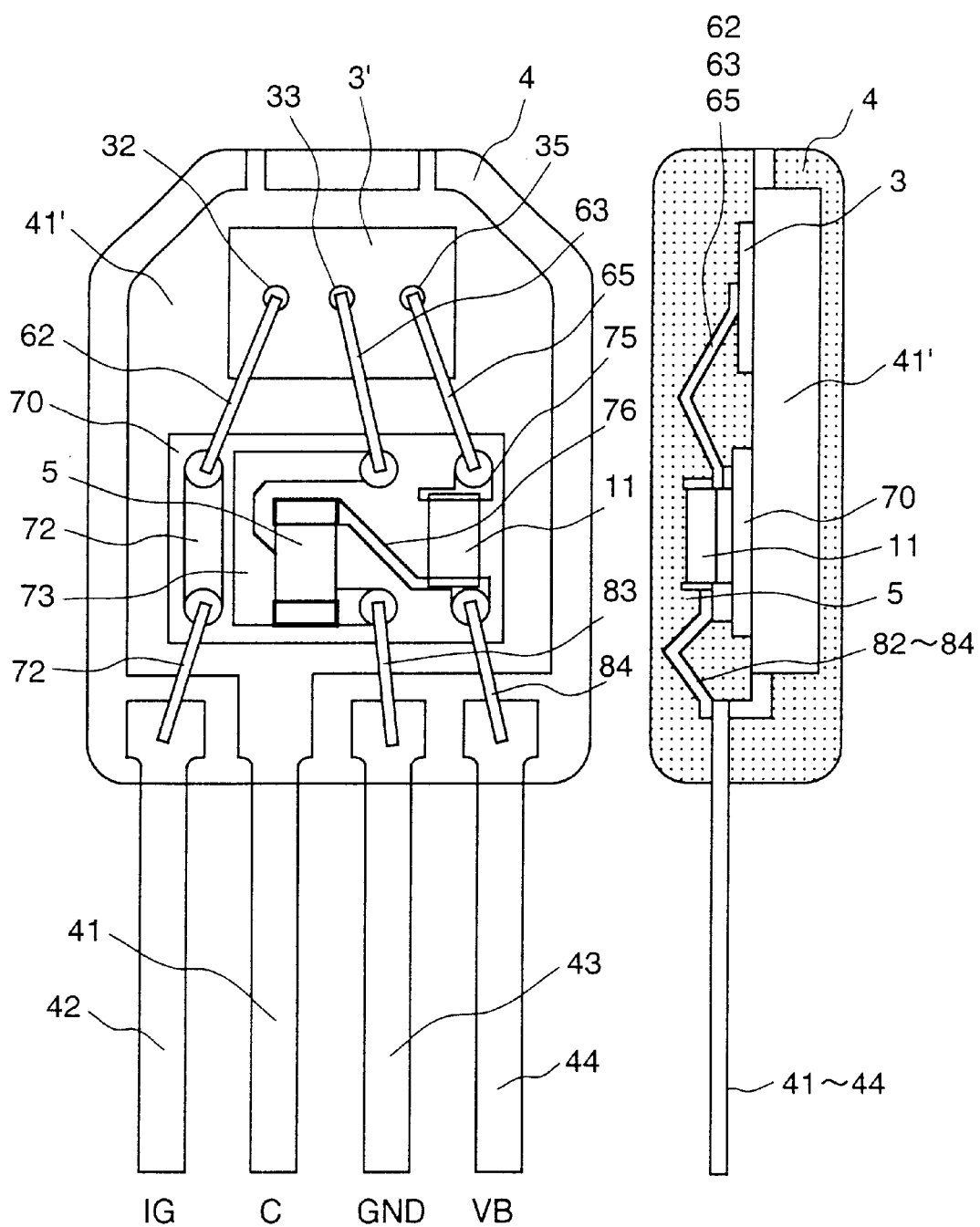
FIG. 12 is a plan view and cross-sectional side view of the packaging unit used in the fifth embodiment of the present invention.

Another embodiment of the igniter driving circuit module in FIG. 9 is shown in FIG. 12 as the fifth embodiment. The present embodiment differs from the embodiment of FIG. 11 in that as with the embodiment of FIG. 8, power resistor 11 and capacitor 5 are mounted on insulating circuit board 70 without being directly connected to the corresponding lead frames, and that circuit board 70 is then mounted on base frame 41' (or 42').

Junction conductor 72 for ignition signal use, junction conductor 73 for grounding, junction conductor 76 for battery power, and junction conductor 75 for power circuit use are deposited on circuit board 70. Capacitor 5 is connected between conductor wires (conductor films) 73 and 76 on circuit board 70 by, for example, soldering, and if circuit board 70 is made of ceramics, resistor 11 will be formed between junction conductors 75 and 76 by, for example, thick-film printing, or if circuit board 70 is made of glass epoxy resin, resistor 11 will be mounted as, for example, a chip-like resistor on the circuit board by, for example, soldering. In addition to improving connection reliability of electronics, the use of circuit board 70 enables the total number of terminals on the lead frames to be reduced, compared with that of the embodiment in FIG. 10.

Figure 13:
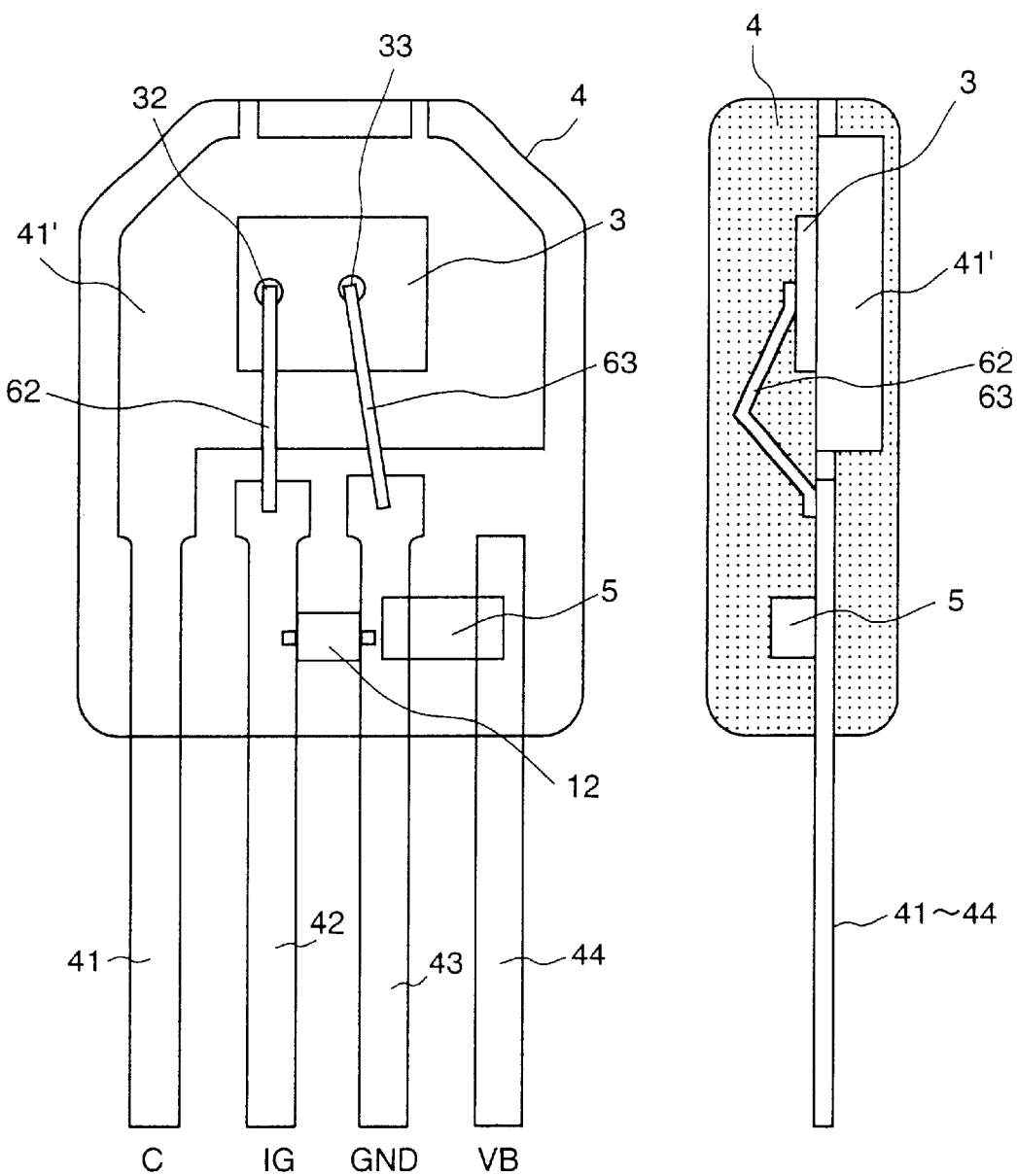
FIG. 13 is a plan view and cross-sectional side view of the packaging unit used in the sixth embodiment of the present invention.

FIG. 13 shows the packaging unit of the igniter pertaining to the sixth embodiment of the present invention.

In this embodiment, the basic composition of circuits is the same as that of the first embodiment. IGBT 6 and the current limiting circuit 7 for IGBT protection from an overcurrent are integrated on single semiconductor chip 3, and radio noise reduction capacitor 5 is connected between power terminal 44 and grounding terminal 43. Also, Zener diode 12 for the confirmation of engine control unit connection is connected between ignition signal input terminal 42 and grounding terminal 43. These components are all built into single packaging unit (transfer molding) 4 provided with external input and output terminals 41 to 44.

Figure 15:
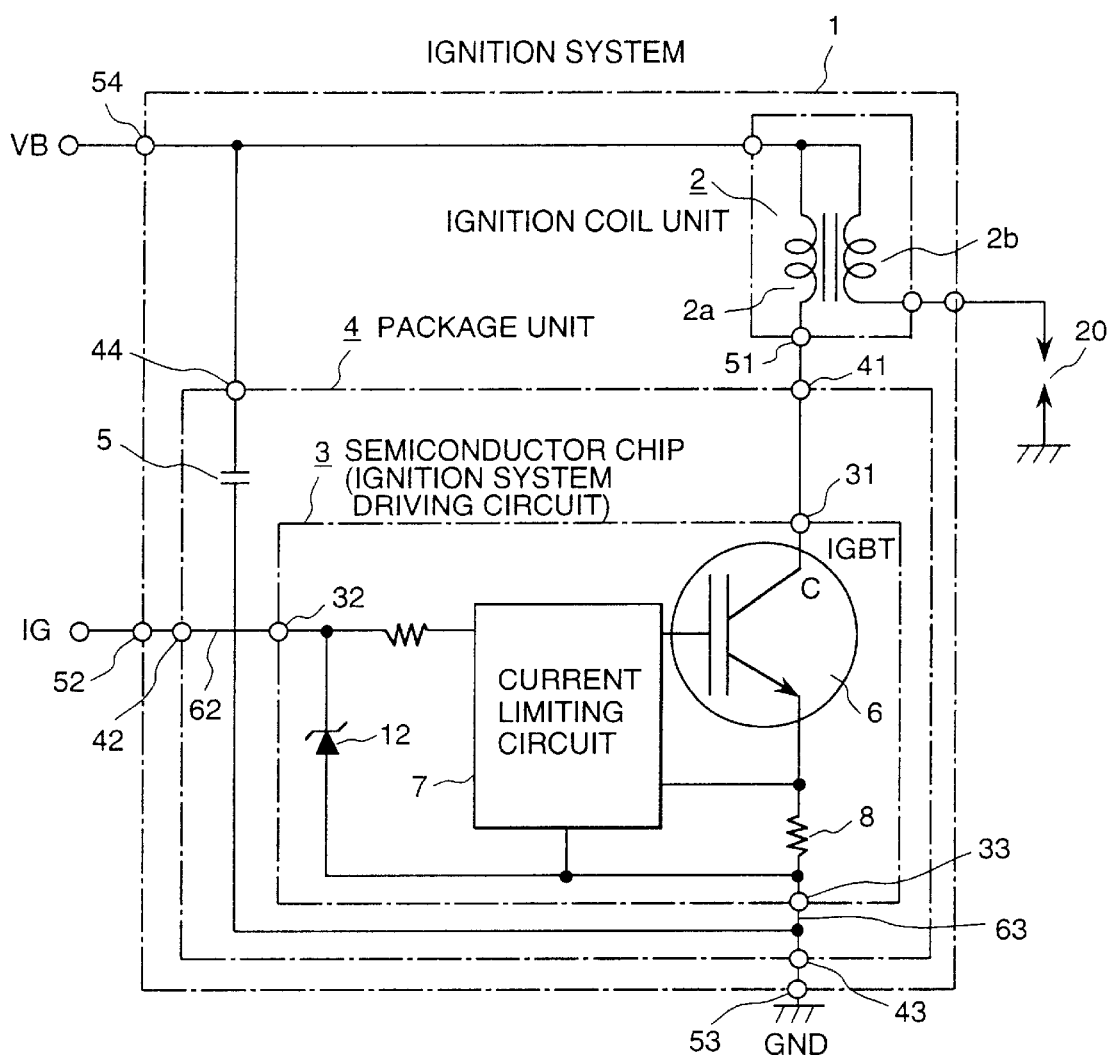
FIG. 15 is a circuit diagram relating to the sixth and seventh embodiments of the present invention.

Such circuit composition is shown in FIG. 15.

Zener diode 12 is provided for the following reasons:

Since ignition signal IG is sent from the engine control unit, if accidental disconnection of ignition signal input connector terminal 52 cannot be confirmed, the resulting trouble can be easily detected.

If the disconnection of this connector or that of the signal line causes a difference in voltage decrease level between the case that the ignition signal level denotes the open status of the output terminal (disconnection of the connector) and the case that the Ignition signal line is connected to connector terminal 52, whether the connector or the signal line is actually disconnected can be judged from the particular signal level at the engine control unit side.

If, however, igniter driving uses a voltage-driven type of IGBT 6, since its current consumption is very small (1 mA or less) and thus since the voltage decrease level is too low, the connector disconnection is difficult to detect intact with the above-mentioned method.

In the present embodiment, therefore, the presence/absence of connector or ignition signal line disconnections can be detected by setting the high level of the ignition signal (IG) to a value between 3 V and 4 V using Zener diode 12 (the ignition signal level under the open terminal status indicating that the connector is disconnected, namely, the original ignition signal level at the engine control unit side is about 5 V) and comparing these signal levels with a predetermined reference level (say, about 4.5 V) at the engine control unit side. For example, if the detected voltage is below the reference level, the igniter will judge the connector to be normal (remaining connected properly), or if the detected voltage is above the reference level, the igniter will judge the connector to be abnormal (disconnected).

In the present embodiment, Zener diode 12 is also contained in packaging unit 4.

Compact igniter design, ease in the assembly and mounting of components, and cost reduction can be achieved in the present embodiment as well.

Figure 14:
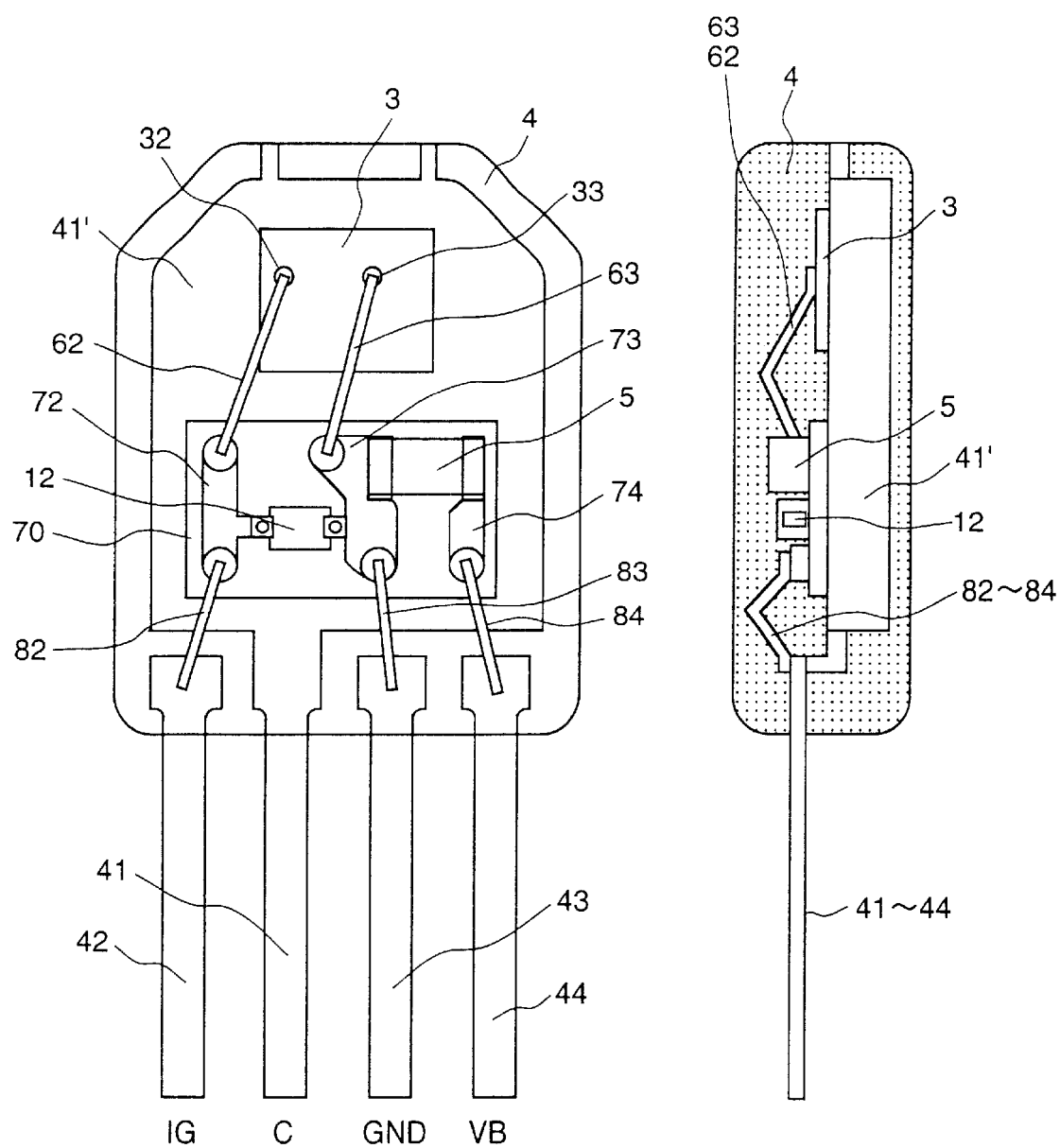
FIG. 14 is a plan view and cross-sectional side view of the packaging unit used in the seventh embodiment of the present invention.

FIG. 14 shows packaging unit 4 into which circuit board 70 was built after Zener diode 12 and radio noise reduction capacitor 5 have been mounted on behalf of the method shown in FIG. 13. The mounting method shown in FIG. 14 uses junction conductors 72, 73, and 74 described hereinbefore.

The use of circuit board 70 creates flexibility in the arrangement of terminals in the packaging unit. Other functions can also be easily added.

The circuits on the above-mentioned circuit board with added functions include, for example, an ion current detection circuit that detects the ion current flowing into the ignition plugs of the internal combustion engine when the secondary coil of the ignition coil unit is ignited and discharged.

According to the embodiments of the present invention, the necessary components can be packaged compactly and collectively on the driving circuit module (IGBT, current limiting circuit, etc.) of the igniter. As a result, it is possible to supply an internal combustion engine-use igniter having functional improvements, permitting easy assembly of components, permitting easy mounting of components in a narrow igniter casing, as with independent ignition coils, without requiring too large a storage space, and reduced in cost.

According to the embodiments of the present invention, it is also possible to mount IGBT alone or together with other components by designing the packaging unit into a standardized composite type, and thus to standardize the ignition coil unit design for mounting this igniter.

What is claimed is:

1. An igniter for an internal combustion engine, using an insulated gate bipolar transistor (IGBT) as the ignition coil switching device for the internal combustion engine, and characterized in that said IGBT and a current limiting circuit for protecting IGBT from an overcurrent are formed on a single semiconductor chip, and that this semiconductor chip and a radio noise reduction capacitor are contained in a single packaging unit having external input and output terminals.

2. Such internal combustion engine-use igniter as set forth in claim 1 above, wherein said igniter is characterized in that said packaging unit is a transfer molding made of epoxy resin, that said semiconductor chip, said radio noise reduction capacitor, and said external input and output terminals are insert-molded in said transfer molding, that an ignition signal input terminal, a collector terminal, and a grounding terminal, each of which is to be connected to the gate, collector, and emitter, respectively, of said IGBT, and a battery power terminal for connection to the plus (+) side of a battery power supply as a special terminal for said radio noise reduction capacitor, are provided as the external input and output terminals, and that the radio noise reduction capacitor is connected between said power terminal and said grounding terminal.

3. Such internal combustion engine-use igniter as set forth in claim 1 above, wherein said igniter is characterized in that said packaging unit is a transfer molding made of epoxy resin, that said semiconductor chip, said radio noise reduction capacitor, and said external input and output terminals are insert-molded in said transfer molding, that an ignition signal input terminal, a collector terminal, and a grounding terminal, each of which is to be connected to the gate, collector, and emitter, respectively, of said IGBT, and a battery power terminal for connection to the plus (+)side of a battery power supply as a special terminal for said radio noise reduction capacitor, are provided as the external input and output terminals, that the radio noise reduction capacitor is so mounted as to be connected to those relay conductors of said power terminal and grounding terminal that are formed on an insulating circuit board, and that the igniter itself is insert-molded together with said insulating circuit board in the transfer molding.

4. Such internal combustion engine-use igniter as set forth in claim 1, wherein said igniter has a Zener diode for the confirmation of engine control unit connection contained in said single packaging unit.

5. Such internal combustion engine-use igniter as set forth in claim 2, wherein said battery power terminal is located next to said grounding terminal.

6. An igniter for an internal combustion engine, using IGBT as the ignition coil switching device for the internal combustion engine, and characterized in that said IGBT, a current limiting circuit for protecting IGBT from overcurrent, and a power supply type circuit operating by obtaining the necessary power from a battery power supply via a power resistor are formed on a single semiconductor chip, except for said power resistor, and that this semiconductor chip and a radio noise reduction/surge absorption capacitor are contained in a single packaging unit having external input and output terminals.

7. Such internal combustion engine-use igniter asset forth in claim 6 above, wherein said power supply type circuit is a self-protection circuit having a current shutoff function to ensure that the "on" duration of the primary current of an ignition coil unit always stays within the preset maximum allowable value.

8. Such internal combustion engine-use igniter as set forth in claim 6 above, wherein said igniter is characterized in that said packaging unit is a transfer molding made of epoxy resin, that said semiconductor chip, said radio noise reduction/surge absorption capacitor, said power resistor, and said external input and output terminals are insert-molded in said transfer molding, that an ignition signal input terminal, a collector terminal, and a grounding terminal, each of which is to be connected to the gate, collector, and emitter, respectively, of said IGBT, power terminals for connection to said power supply type circuit, and a battery power terminal for connection to the plus (+) side of a battery power supply as a special terminal for said radio noise reduction/surge absorption capacitor, are provided as the external input and output terminals, that the radio noise reduction/surge absorption capacitor is connected between said power terminal and said grounding terminal, and that the power resistor is connected between the battery power terminal and the power terminals of said power supply type circuit.

9. Such internal combustion engine-use igniter as set forth in claim 4 above, wherein said igniter is characterized in that said packaging unit is a transfer molding made of epoxy resin, that said semiconductor chip, said radio noise reduction/surge absorption capacitor, said power resistor, and said external input and output terminals are insert-molded in said transfer molding, that an ignition signal input terminal, a collector terminal, and a grounding terminal, each of which is to be connected to the gate, collector, and emitter, respectively, of said IGBT, power terminals for connection to said power supply type circuit, and a battery power terminal for connection to the plus (+) side of a battery power supply as a special terminal for said radio noise reduction/surge absorption capacitor, are provided as the external input and output terminals, that the radio noise reduction/surge absorption capacitor and the power resistor are so mounted as to be connected between those relay conductors of said battery power terminal, power terminals of the power supply type circuit, and said grounding terminal that are formed on an insulating circuit board, and that the igniter itself is insert-molded together with said insulating circuit board in the transfer molding.

10. Such internal combustion engine-use igniter as set forth in claim 9 above, wherein, if a ceramic circuit board is used as said insulating circuit board, said radio noise reduction/surge absorption capacitor is connected to the circuit board by soldering, electroconductive bonding, or the like, and said power resistor is either a printed thick-film resistor or a chip resistor secured to the circuit board by soldering, electroconductive bonding, or the like, or if a glass epoxy circuit board is used as the insulating circuit board, the radio noise reduction/surge absorption capacitor and the power resistor are connected to the circuit board by soldering, electroconductive bonding, or the like.

11. An igniter for an internal combustion engine, using IGBT as the ignition coil switching device for the internal combustion engine, and characterized in that said IGBT and a current limiting circuit for protecting IGBT from an overcurrent are formed on a single semiconductor chip, and that this semiconductor chip and a Zener diode for the confirmation of engine control unit connection are contained in a single packaging unit having external input and output terminals.

12. Such internal combustion engine-use igniter as set forth in claim 11 above, wherein said igniter is characterized in that said packaging unit is a transfer molding made of epoxy resin, that said semiconductor chip, said Zener diode, and said external input and output terminals are insert-molded in said transfer molding, that an ignition signal input terminal, a collector terminal, and a grounding terminal, each of which is to be connected to the gate, collector, and emitter, respectively, of said IGBT, are provided as the external input and output terminals, and that the Zener diode is connected between said ignition signal input terminal and said grounding terminal.

13. An igniter for an internal combustion engine, using IGBT as the ignition coil switching device for the internal combustion engine, and characterized in that said IGBT and igniter driving circuits having a current limiting circuit for protecting ICRT from an overcurrent are formed on a single semiconductor chip, and that this semiconductor chip and a circuit board with an added function different from an ignition coil driving function are contained in a single packaging unit having external input and output terminals.

14. Such internal combustion engine-use igniter as set forth in claim 13 above, wherein the circuit on the circuit board equipped with the added function mentioned above is an ion current detection circuit for detecting the ion current flowing into the ignition plugs of the internal combustion engine when the secondary coil of the ignition coil unit is ignited and discharged.

15. An igniter for an internal combustion engine, characterized in that said igniter is of the independent ignition type having ignition coils and igniter driving circuits as its integrated main ignition unit, which is connected to the ignition plugs of the internal combustion engine, that the packaging unit set forth in either claim from 1 to 14 above is stored within either the coil casing that contains said igniter driving circuits, or the igniter casing integrated with said coil casing, that the coil casing or the igniter casing has connector terminals for external connection and terminals for coil connection, and that the external input and output terminals corresponding to said packaging unit are connected to these connector terminals and ignition coil connection terminals.

* * * * *